United States Patent
Swope et al.

(10) Patent No.: US 7,148,695 B2
(45) Date of Patent: Dec. 12, 2006

(54) FAULT DETECTION SYSTEM

(75) Inventors: John Malvern Swope, Sacramento, CA (US); Kevin E. Boyum, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/112,121

(22) Filed: Apr. 22, 2005

(65) Prior Publication Data

US 2006/0238204 A1    Oct. 26, 2006

(51) Int. Cl.
*G01R 31/08* (2006.01)

(52) U.S. Cl. ...................... 324/522; 324/531
(58) Field of Classification Search ................ 324/522, 324/531
See application file for complete search history.

(56) References Cited

U.S. PATENT DOCUMENTS

| | | | |
|---|---|---|---|
| 5,568,373 A * | 10/1996 | Small | 363/132 |
| 5,623,596 A | 4/1997 | Townsley et al. | |
| 6,031,743 A * | 2/2000 | Carpenter et al. | 363/65 |
| 6,202,171 B1 | 3/2001 | Townsley et al. | |
| 7,002,352 B1 * | 2/2006 | Rogers et al. | 324/522 |
| 2006/0043943 A1 * | 3/2006 | Rose | 323/280 |

* cited by examiner

*Primary Examiner*—Walter Benson (57) ABSTRACT

A fault detection system includes a fault indicator and power monitors coupled to the fault indicator. The fault indicator is configured to indicate a fault for a first one of the power monitors which detects a corresponding voltage is not between a corresponding maximum value and a corresponding minimum value.

25 Claims, 4 Drawing Sheets

FAULT DETECTION SYSTEM

BACKGROUND

Electronic systems such as computer systems frequently include electrical components that have different power supply requirements. To meet these requirements, many computer systems include power supply systems that have distributed power architectures. With distributed power architectures, an AC to DC power supply is used to generate intermediate voltages, and additional DC to DC voltage converters are used to generate signaling voltages. The DC to DC converters typically convert a higher DC voltage level to a lower DC signaling voltage level. The input voltage for each DC to DC converter is typically supplied from the AC to DC power supply or from other DC to DC converters.

One problem that arises with distributed power architectures is that if one converter is faulty, multiple converts may shut down as a result, thereby making it difficult to determine which converter is the faulty converter. This is because each converter usually relies on one or more other converters in order to generate an output voltage. For example, power converters can have inputs which include a source voltage rail, a bias rail to power electrical circuits that are internal to the power converter, and other rails which provide enable inputs. If any of these inputs fails, the power converter will not operate and will shut down. Furthermore, other power converters that receive inputs from the faulty power converter will also shut down. As a result, with distributed power architectures, if one power converter shuts down, other power converters will shut down almost simultaneously, thereby making a diagnosis of which power converter is the faulty converter very difficult.

Several approaches have been employed to diagnose failed power converters in distributed power systems. One approach is to monitor each power converter during normal operation. When one power converter has an output voltage which goes out of regulation or fails, other power converters usually will also fail. Since every power converter is being monitored, the first power converter to fail can be determined. A disadvantage of this approach is that very precise timing resolution is employed to determine the first power converter to fail. For example, if the status of each power converter is obtained by polling the power converters at periodic intervals, if several power converters fail within a period of time which is less than the periodic interval, the power converter that failed first will not be able to be identified.

Another approach is to employ a voltage monitor that can monitor a number of power converters and provide a warning if any of the power converters goes out of regulation or fails. Voltage monitors are typically designed to support a fixed number of power converters and can identify the first converter to fail in a group of power converters. A disadvantage of employing voltage monitors is that if fewer than the fixed number of power converters is used, the relative cost per converter is increased, and if greater than the fixed number of power converters are used, it can become difficult to determine which power converter was the first to fail.

SUMMARY

One aspect of the invention provides a fault detection system. The fault detection system includes a fault indicator and power monitors coupled to the fault indicator. The fault indicator is configured to indicate a fault for a first one of the power monitors which detects a corresponding voltage is not between a corresponding maximum value and a corresponding minimum value.

DETAILED DESCRIPTION

Figure 1:
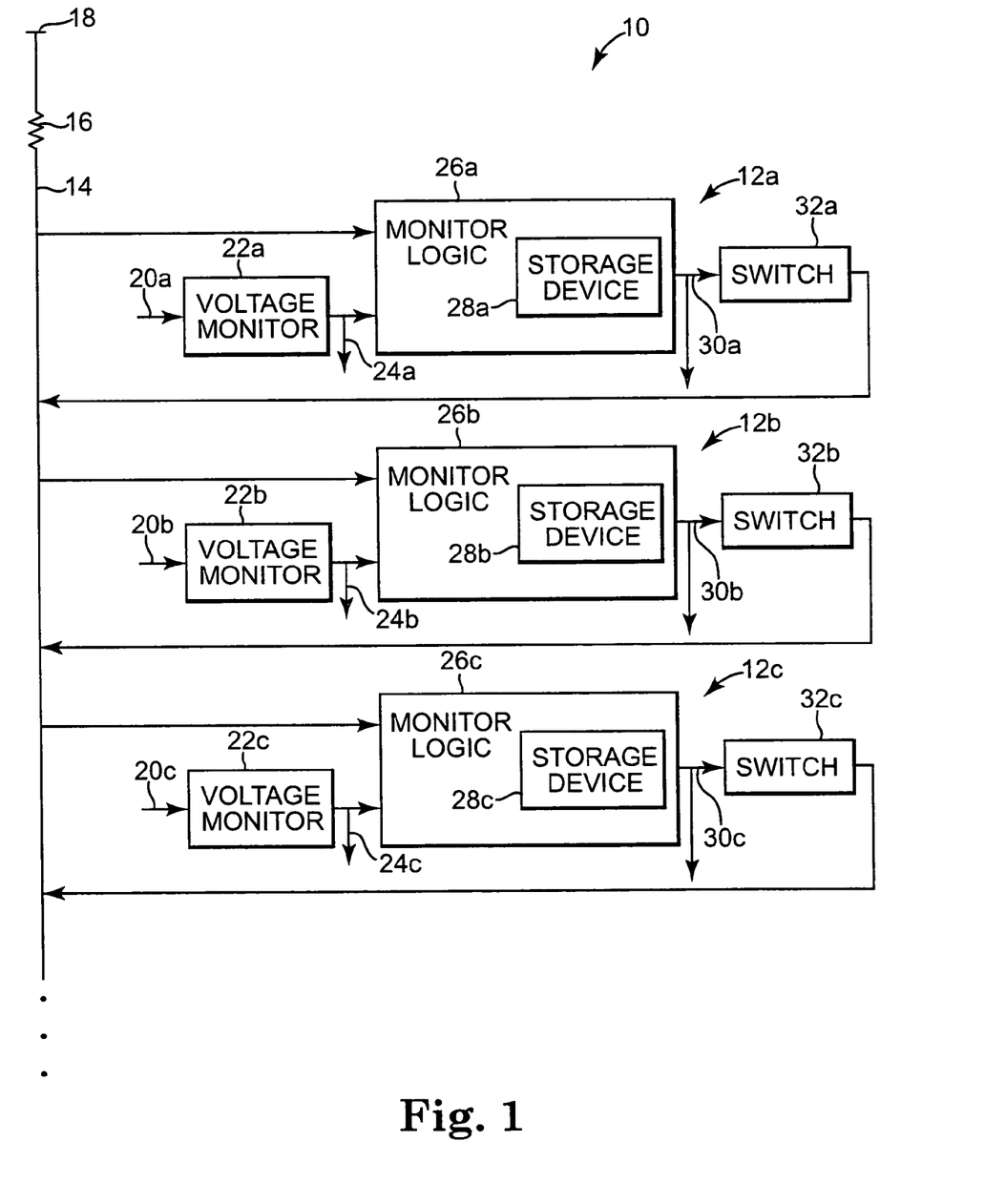
FIG. 1 is a block diagram illustrating one embodiment of a fault detection system.

FIG. 1 is a block diagram illustrating one embodiment of a fault detection system 10. Fault detection system 10 includes power monitors 12a–12c. While three power monitors 12a–12c are illustrated, in other embodiments, any suitable number of power monitors 12 can be employed. In the illustrated embodiment, each power monitor 12 includes a voltage monitor 22, monitor logic 26 and a switch 32. Each power monitor 12 includes an input from bus 14 to monitor logic 26 and an output to bus 14 from switch 32. Voltage monitors 22a–22c are coupled to corresponding inputs 20a–20c that are voltage levels that power monitors 12a–12c are monitoring. In one embodiment, power monitor 12 can monitor voltage rails that are coupled to corresponding power supplies or power converters. In one embodiment, the power converters include AC to DC converters, DC to DC converters or both AC to DC converters and DC to DC converters. In other embodiments, the DC to DC converters have one or more inputs that are coupled to voltages provided by one or more other DC to DC converters, or that are coupled to voltage rails powered by one or more other DC to DC converters.

In the illustrated embodiment, bus 14 is coupled to a supply voltage 18 through a resistor 16. Bus 14 functions as a fault indicator and can be switched or asserted from a first voltage level or unasserted state to a second voltage level or asserted state by any one of power monitors 12a–12c in order to indicate that a fault has been detected by one of power monitors 12a–12c. In the illustrated embodiment, the first voltage level corresponds to a first state and the second voltage level corresponds to a second state. Bus 14 can follow any suitable bus protocol which provides for the bus being set at a first voltage level and a second voltage level. In other embodiments, bus 14 is not employed and other suitable logic or data storage devices that can store at least a first state and a second state are employed. In one embodiment, the data storage device includes one or more data storage locations that can store the first state and the second state. In this embodiment, any of the power monitors 12a–12c can switch the data stored in the data storage locations from the first state to the second state in order to indicate that a fault has been detected by power monitors 12a–12c.

In the illustrated embodiment, each power monitor 12a–12c indicates a fault for a first one of the power monitors 12a–12c which detects that a voltage received at inputs 20a–20c is out of regulation or not between a corresponding maximum value and a corresponding minimum value. In this embodiment, power monitors 12a–12c are detecting a voltage fault at inputs 20a–20c. Each voltage level at each input 20a–20c has a nominal value and is in regulation if between a maximum voltage value which is greater than the nominal voltage value and a minimum voltage value which is less than the nominal voltage value. Each power monitor 12a–12c can monitor voltages which have different nominal values and different maximum or minimum values at which the corresponding input voltage at 20a–20c is out of regulation. For example, in one embodiment, power monitor 12a is monitoring a voltage level which is 48 $V_{DC}$, power monitor 12b is monitoring a voltage level which is 5 $V_{DC}$, and power monitor 12c is monitoring a voltage level which is 2 $V_{DC}$. In this embodiment, the voltage regulation level is 10%, and the voltage level of 48 $V_{DC}$ is in regulation if between 43.2 $V_{DC}$ and 52.8 $V_{DC}$, the voltage level of 5 $V_{DC}$ is in regulation if between 4.5 $V_{DC}$ and 5.5 $V_{DC}$, and the voltage level of 2 $V_{DC}$ is in regulation if between 1.8 $V_{DC}$ and 2.2 $V_{DC}$. In other embodiments, any suitable regulation level can be used for each of the power monitors 12a–12c.

In the illustrated embodiment, voltage monitors 22a–22c each provide an output at corresponding path 24a–24c to indicate a fault when any of the corresponding voltages at inputs 20a–20c goes out of regulation or is not between the corresponding maximum value and the corresponding minimum value. In various embodiments, any suitable circuit arrangement can be used for voltage monitors 22. In one embodiment, each voltage monitor 22 includes first and second comparators that are configured to have "+" and "−" reference voltage inputs that are a percentage of the nominal value of the voltage being monitored. The reference voltage values can be provided by other suitable circuits or logic which can include resistor networks or digital to analog converters. The percentage used for the reference voltage inputs can be any suitable value. In one embodiment, the percentage is 10% and the first reference voltage input is 110% of the nominal voltage at path 20 and the second reference voltage input is 90% of the nominal voltage at path 20. In this embodiment, the input voltage at path 20 is coupled to the "+" input of the first comparator and the first reference voltage input is coupled to the "−" input of the first comparator. If the voltage at path 20 rises above the first reference voltage value at the "−" input, the first comparator provides an output. The input voltage at path 20 is also coupled to the "−" input of the second comparator and the second reference voltage input is coupled to the "+" input of the second comparator. If the voltage at path 20 falls below the second reference voltage value at the "+" input, the second comparator provides an output. The first and second comparators have outputs that are coupled to suitable logic that provides a first signal to monitor logic 26 via path 24 when either the first comparator or the second comparator are providing an output when the voltage input at 20 goes out of regulation.

In the illustrated embodiment, power monitors 12a–12c can each provide a first signal at corresponding path 24a–24c and a second signal at corresponding path 30a–30c. Each power monitor 12 provides the first signal at path 24 when the voltage received at input 20 is out of regulation. The first power monitor 12 that detects that the voltage at input 20 is out of regulation provides the second signal at path 30. Other power monitors 12 that subsequently detect that the voltage at input 20 is out of regulation do not provide the second signal at path 30. For example, if the voltage at input 20a goes out of regulation before the voltages at 20b and 20c, power monitor 12a provides the first signal at 24a and the second signal at 30a. If the voltage at input 20b is the next to go out of regulation, power monitor 12b provides the first signal at 24b but does not provide the second signal at 30b. Alternatively, if the voltage at input 20c is the next to go out of regulation, power monitor 12c provides the first signal at 24c but does not provide the second signal at 30c.

In the illustrated embodiment, each monitor logic 26a–26c includes a corresponding storage device 28a–28c. Each monitor logic 26a–26c has an input coupled to bus 14 and can switch storage device 28a–28c from a first state to a second state if bus 14 is not asserted (at the first voltage level) and the corresponding voltage monitor 22a–22c is providing the first signal indicating that the voltage at the corresponding input 20a–20c has gone out of regulation. When bus 14 is in the unasserted state (at the first voltage level), all of the voltages at inputs 20a–20c are in regulation. Bus 14 is asserted (switched to an asserted state or the second voltage level) by the first one of power monitors 12a–12c which detects that the voltage at corresponding input 20a–20c has gone out of regulation.

In the illustrated embodiment, power monitors 12a–12c also include switches 32a–32c. Switches 32a–32c are coupled to bus 14 and are coupled to monitor logic 26a–26c via respective paths 30a–30c. Switches 32a–32c are configured to assert bus 14 and change the state of bus 14 from the unasserted state (the first voltage level) to the asserted state (the second voltage level) when the corresponding storage device 28a–28c is switched from the first state to the second state. That is, one of switches 32 asserts the bus when the corresponding monitor logic 26 provides the first signal at 24 and the second signal at 30.

In the illustrated embodiment, the first voltage level is a high voltage level if none of the switches 32a–32c is asserting bus 14. When none of the switches 32a–32c is asserting bus 14, bus 14 is indicating the first state or the high voltage level. Bus 14 continues to indicate the first state until the first power monitor 12a–12c detects that the corresponding voltage at corresponding input 20a–20c is out of regulation. At this time, bus 14 is set to the second state. When bus 14 is indicating the second state, bus 14 is at a low voltage level (the second voltage level) because one of the switches 32a–32c is asserting (pulling down) bus 14. In this embodiment, switches 32a–32c are coupled to a ground potential and pull bus 14 to the ground potential when asserted. Switches 32a–32c provide a high impedance between bus 14 and the ground potential when none of the switches 32a–32c are asserting bus 14. Because bus 14 is coupled to the supply voltage 18 through pull-up resistor 16, when switches 32a–32c provide the high impedance between bus 14 and ground, bus 14 is at a high voltage level (the first voltage level) which is equal to the voltage supply at 18.

In another embodiment, bus 14 is at the high voltage level (the second voltage level) which is equal to the supply voltage at 18 if any of the switches 32a–32c are asserting (pulling up) bus 14. Bus 14 is at the low voltage level (the first voltage level) which is equal to the ground potential if switches 32a–32c are providing the high impedance between bus 14 and the supply voltage at 18.

Figure 2:
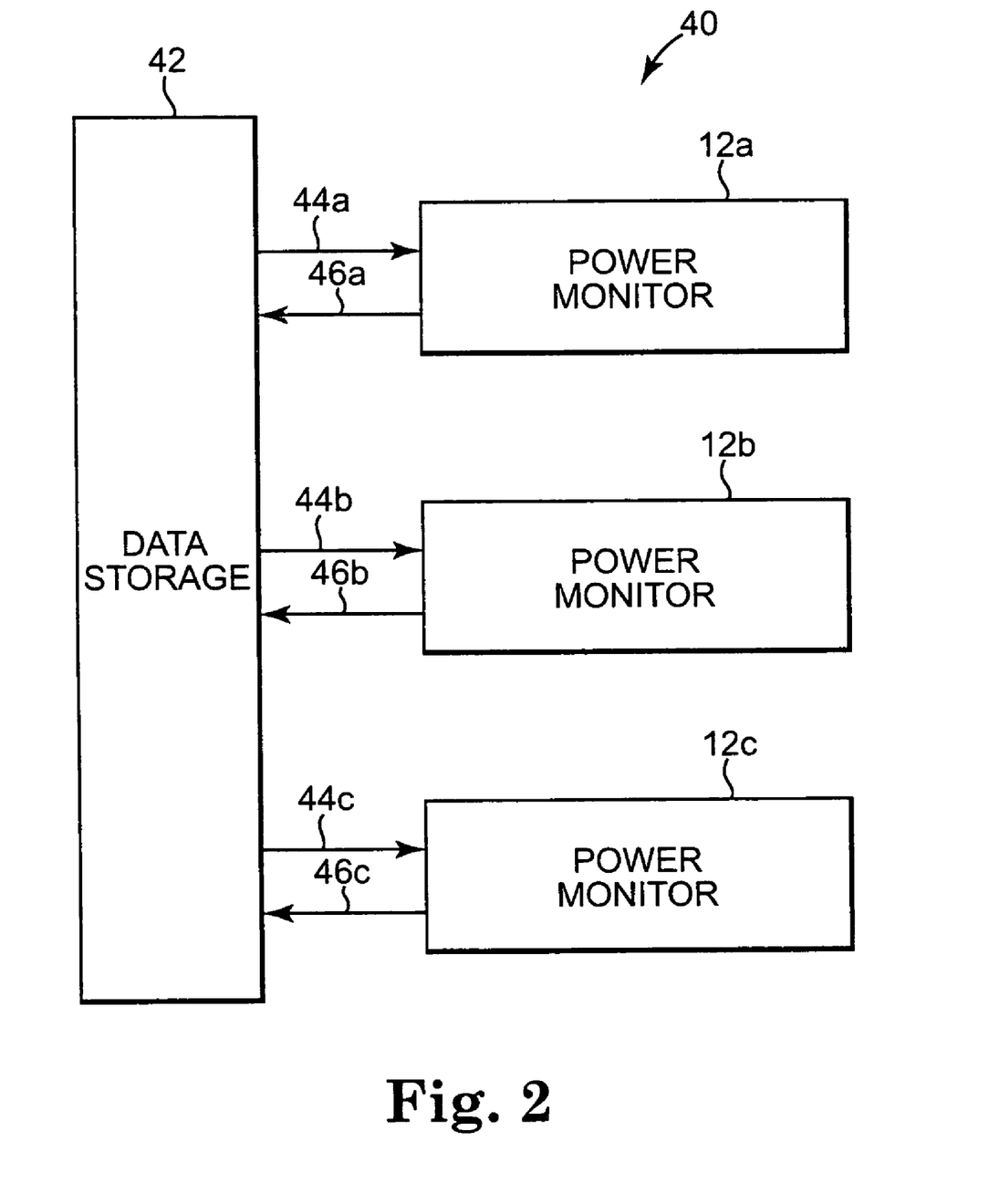
FIG. 2 is a block diagram illustrating one embodiment of a fault detection system.

FIG. 2 is a block diagram illustrating one embodiment of a fault detection system 40. In this embodiment, three power monitors 12a–12c are illustrated. In other embodiments, any suitable number of power monitors 12 can be used. In the illustrated embodiment, each power monitor 12a–12c is coupled to data storage device 42 via a corresponding input at 44a–44c and a corresponding output at 46a–46c. Data storage device 42 includes one or more data storage locations that store at least a first state and a second state. The embodiment illustrated in FIG. 2 is similar to the embodiment illustrated in FIG. 1 except that bus 14 is not used.

In the illustrated embodiment, data storage device 42 indicates the first state until the first power monitor 12a–12c that detects that the corresponding voltage is not between the corresponding maximum value and the corresponding minimum value sets one or more data storage locations within data storage device 42 to the second state. In this embodiment, switches 32a–32c assert logic within data storage device 42 to change the data storage locations to the second state. Each power monitor 12a–12c determines if data storage device 42 is storing the second state via path 44a–44c when the first signal is received from one of the corresponding voltage monitors 22a–22c. If data storage device 42 is not storing the second state, the power monitor 12a–12c which received the first signal provides the second signal which causes the corresponding one of the switches 32a–32c to assert logic within data storage device 42 and change one or more of the data storage locations to the second state.

In one embodiment, data storage device 42 can record information which includes identification of which one of the power monitors 12a–12c have provided the first signal via path 24a–24c or the second signal via path 30a–30c. This information can also include identification of power supplies or power converters that are providing the voltages at inputs 20a–20c. The power converters can include any suitable number of AC to DC converters and DC to DC converters. This information can also include identification of voltage rails that are coupled to paths 20a–20c. In other embodiments, any suitable information can be stored within data storage device 42.

Figure 3:
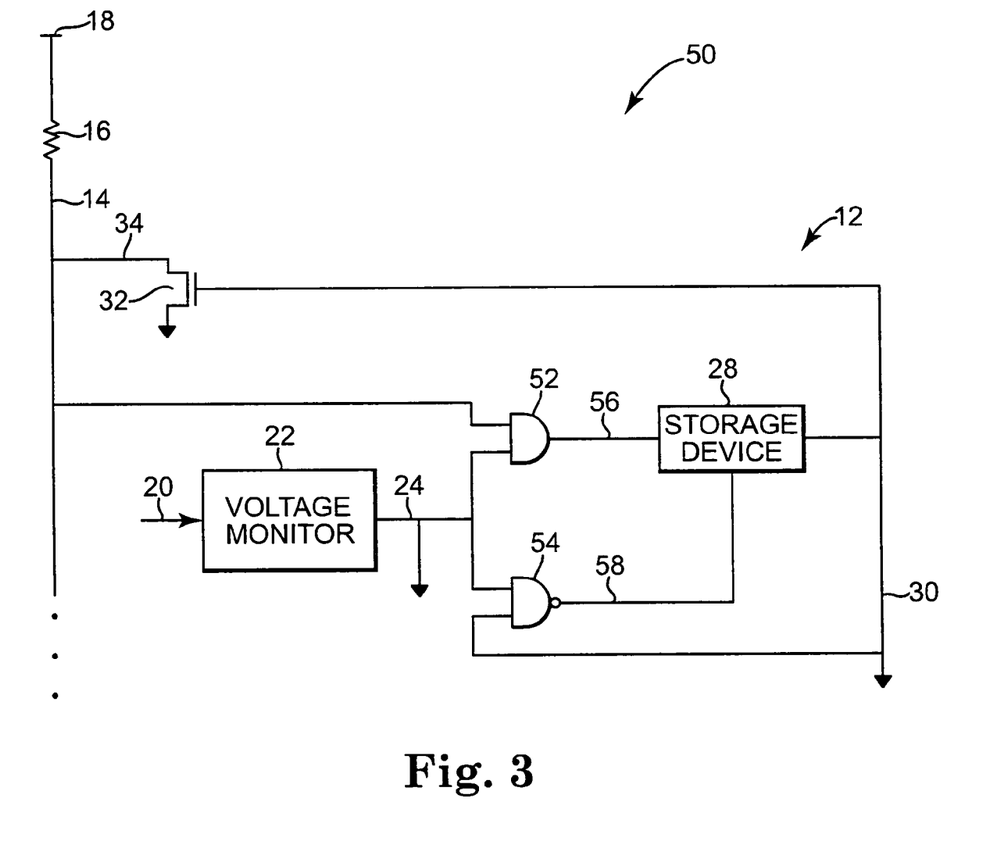
FIG. 3 is a block diagram illustrating one embodiment of a power monitor in a fault detection system.

FIG. 3 is a block diagram illustrating one embodiment of a power monitor 12 in a fault detection system 50. Power monitor 12 includes voltage monitor 22 which monitors a voltage or voltage rail at input 20. Voltage monitor 22 has an output at path 24 which is coupled to AND gate 52 and NAND gate 54. AND gate 52 has a second input coupled to bus 14 and has an output at path 56 which is coupled to an input of storage device 28. NAND gate 54 has an output at 58 which is coupled to an enable terminal of storage device 28. Storage device 28 has an output at 30 which is coupled to a second input of NAND gate 54 and to a gate of n-channel transistor 32. N-channel transistor 32 has a drain which is coupled to bus 14 and a source which is coupled to ground. In this embodiment, storage device 28 can be any suitable type of device such as a latch that can store a first state or a second state received at path 56 when the enable terminal at 58 is asserted and lock the stored state in storage device 28 when the enable terminal at 58 is not asserted. While switch 32 is illustrated as an n-channel transistor, in other embodiments, other suitable switches can be used. For example, in one embodiment, switch 32 is a bipolar transistor.

In the illustrated embodiment, storage device 28 is initialized to a first state before the voltage is monitored at path 20. Bus 14 is also initialized to the high voltage level or unasserted state as the power monitor 12 and the other power monitors 12 (not shown) have not yet detected a voltage which is out of regulation. When storage device 28 is storing the first state, path 30 is at a low logic level, NAND gate 54 is asserting the enable terminal via path 58, and n-channel transistor 32 is turned off and is in a high impedance state. If voltage monitor 22 detects that the voltage at input 20 is out of regulation, a first signal is provided on path 24 by switching path 24 to a high logic level. This enables AND gate 52 to pass the state of bus 14 to storage device 28. If bus 14 is at a high voltage level, none of the other power monitors 12 have detected a voltage at path 20 which is out of regulation. Since bus 14 is at the high voltage level or high logic level, storage device 28 is switched from the first state (which corresponds to the asserted state of bus 14) to the second state (which corresponds to the current unasserted state of bus 14). When storage device 28 is in the second state, path 30 is at a high logic level thereby providing the second signal at path 30. Because the gate of n-channel transistor 32 is now at a high logic level (or high voltage level), n-channel transistor is turned on to a low impedance state and bus 14 is pulled down to the low voltage level or asserted state. The high logic level on path 30 in combination with the first signal being asserted on path 24 causes the output of NAND gate 54 to switch to a low logic level. Since the enable terminal of storage device 28 at path 58 is not asserted, the second state is locked into storage device 28 while voltage monitor 22 is providing the first signal. This prevents the new state of bus 14 (the asserted state) from being passed to storage device 28.

If voltage monitor 22 detects that the voltage at input 20 is out of regulation and bus 14 is already at a low voltage level or asserted state, another power monitor 12 has detected another voltage at another corresponding path 20 that is out of regulation and has switched bus 14 to the asserted state. In this case, voltage monitor 22 will still provide the first signal on path 24 by switching path 24 to the high logic level. This enables AND gate 52 to pass the state of bus 14 to storage device 28. Since bus 14 is at the low logic level and storage device 28 has been initialized to the first state which is a low logic level, the state of storage device 28 does not change. The second signal is not provided at path 30 because the output of storage device 28 at path 30 remains at the low logic level.

Figure 4:
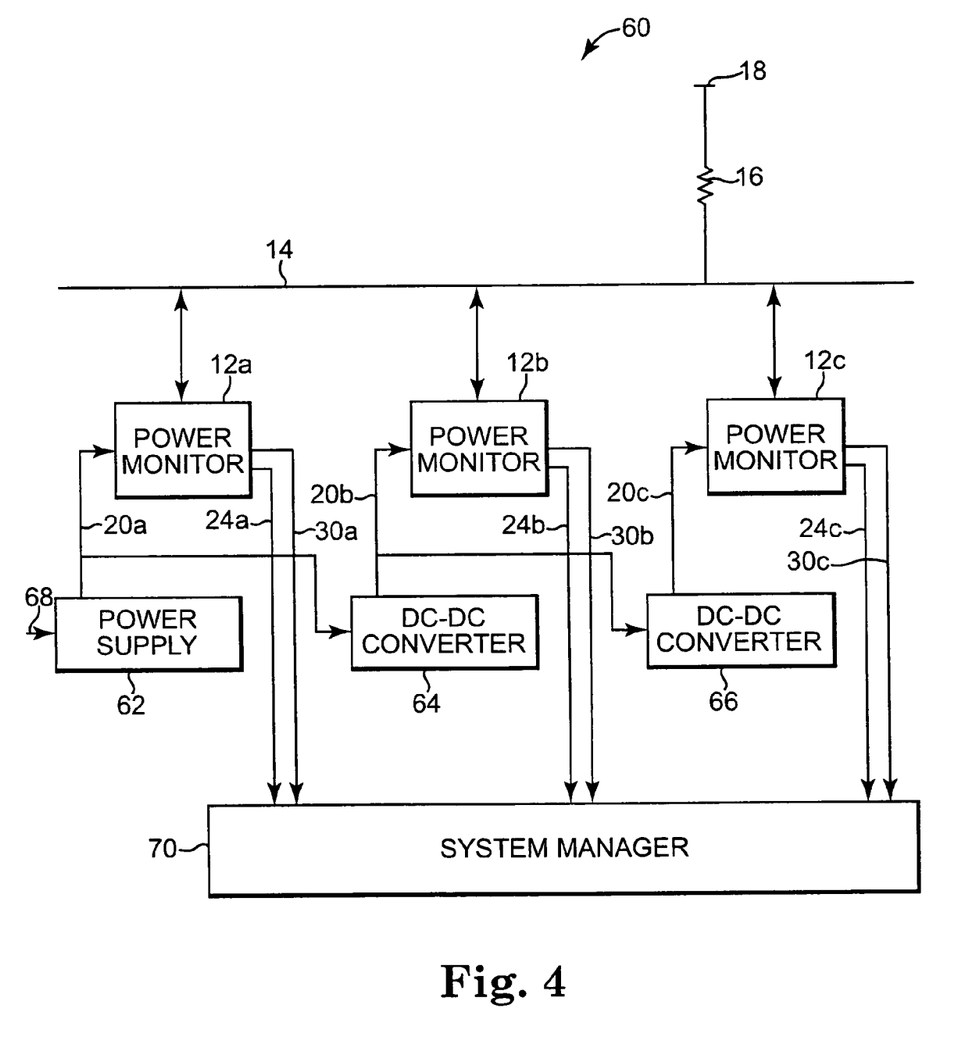
FIG. 4 is a block diagram illustrating one embodiment of a fault detection system.

FIG. 4 is a block diagram illustrating one embodiment of a fault detection system 60. Fault detection system 60 includes power monitors 12a–12c. While three power monitors 12a–12c are illustrated, in other embodiments, any suitable number of power monitors 12 can be used. In the illustrated embodiment, power monitor 12a is coupled to an output of power supply 62 at path 20a, power monitor 12b is coupled to an output of DC to DC converter 64 at path 20b, and power monitor 12c is coupled to an output of DC to DC converter 66 at path 20c. Paths 20a, 20b and 20c are voltage rails which receive output voltages from power supply 62, DC to DC converter 64 and DC to DC converter 66, respectively. In this embodiment, power supply 62 receives an input voltage of 110 $V_{AC}$ on path 68 and provides an output voltage of 48 $V_{DC}$ on path 20a. DC to DC converter 64 receives an input voltage of 48 $V_{DC}$ on path 20a and provides an output voltage of 5 $V_{DC}$ on path 20b. DC to DC converter 66 receives an input voltage of 5 $V_{DC}$ on path 20b and provides an output voltage of 2 $V_{DC}$ on path 20c.

In the illustrated embodiment, the voltage regulation level is 10%. Therefore, the power supply 62 output voltage of 48 $V_{DC}$ is in regulation when the voltage is between 43.2 $V_{DC}$ and 52.8 $V_{DC}$. The DC to DC converter 64 output voltage of 5 $V_{DC}$ is in regulation when the voltage is between 4.5 $V_{DC}$ and 5.5 $V_{DC}$. The DC to DC converter 66 output voltage of 2 $V_{DC}$ is in regulation when the voltage is between 1.8 $V_{DC}$ and 2.2 $V_{DC}$. In other embodiments, any suitable regulation level can be used for power supply 62, DC to DC converter 64 and DC to DC converter 66.

In the illustrated embodiment, bus 14 is coupled to a supply voltage 18 through a resistor 16. Bus 14 functions as a fault indicator and can be switched or asserted from a first voltage level or unasserted state to a second voltage level or asserted state by any one of power monitors 12a–12c in order to indicate that a fault has been detected by one of the power monitors 12a–12c. Bus 14 can follow any suitable bus protocol which provides for the bus being set at a first voltage level and a second voltage level. In other embodiments, bus 14 is not used and other suitable logic or data storage devices that can store at least a first state and a second state are used. In one embodiment, the data storage device includes one or more data storage locations that can store the first state and the second state. In this embodiment, any one of the power monitors 12a–12c can switch the data stored in the date storage locations from the first state to the second state in order to indicate that a fault has been detected by power monitors 12a–12c.

In the illustrated embodiment, each power monitor 12a–12c can provide a first signal at a corresponding path 24a–24c and a second signal at a corresponding path 30a–30c. Each power monitor 12 operates as follows. When the voltage received at path 20 is out of regulation, the first signal is provided at path 24. If the voltage received at path 20 is the first voltage to go out of regulation, the second signal is provided at path 30. Other power monitors 12 that subsequently detect that the voltage at their respective input 20 is out of regulation do not provide the second signal at path 30. For example, if the voltage at 20a goes out of regulation before the voltages at 20b and 20c, power monitor 12a provides the first signal at 24a and the second signal at 30a. If the voltage at 20b is the next to go out of regulation, power monitor 12b provides the first signal at 24b, but does not provide the second signal at 30b. Alternatively, if the voltage at input 20c is the next to go out of regulation, power monitor 12c provides the first signal at 24c but does not provide the second signal at 30c.

In the illustrated embodiment, a system manager 70 is coupled to the first signal outputs 24a–24c and the second signal outputs 30a–30c from power monitors 12a–12c. System manager 70 stores information which includes identification of the power monitors 12a–12c which provide the first signals and the second signal. That is, system manager 70 stores information which includes identification of the first one and every one of power supply 62, DC to DC converter 64 or DC to DC converter 66 that goes out of regulation. In other embodiments, system manager 70 can store any suitable information about power supply 62, DC to DC converter 64 or DC to DC converter 66, or alternatively, about any voltage rail 20a–20c which goes out of regulation.

In the embodiment illustrated in FIG. 4, three power monitors 12a–12c are illustrated, however, in other embodiments other suitable numbers of power monitors 12 can be employed. Each power monitor 12 provides two outputs (i.e., outputs 24 and 30) to system manager 70. As a result, there is a large number of wires from the outputs of power monitors 12 to system manager 70 as more power monitors are employed. For example, 50 power monitors 12 would employ 100 wires to couple each of the outputs 24 and 30 to system manager 70. In one embodiment, a common multi-drop bus is employed to couple the power monitor outputs 24 and 30 to system manager 70. In one example embodiment, such a bus is implemented with an I²C bus which includes only two wires to couple outputs 24 and 30 of all power monitors 12 to system manager 70. Other suitable common multi-drop buses other than the I²C bus could also be employed.

Embodiments of fault detection systems, similar to fault detection system 10 of FIG. 1, fault detection system 40 of FIG. 2, and fault detection system 60 of FIG. 4 can be implemented in a single integrated circuit. In other embodiments of such fault detection systems, the fault detection systems can be implemented in hardware, software, or firmware, or any combination thereof.

Although specific embodiments have been illustrated and described herein, it will be appreciated by those of ordinary skill in the art that a variety of alternate and/or equivalent implementations may be substituted for the specific embodiments shown and described without departing from the scope of the invention. This application is intended to cover any adaptations or variations of the specific embodiments discussed herein. Therefore, it is intended that this invention be limited only by the claims and the equivalents thereof.

What is claimed is:

1. A fault detection system, comprising:
   power monitors, each configured to detect when a corresponding voltage is not between a corresponding maximum value and a corresponding minimum value and to provide a first signal and a second signal, wherein the first signal is provided any time the corresponding voltage is not between the corresponding maximum value and the corresponding minimum value, and wherein the second signal is provided only for the first one of the power monitors which detects the corresponding voltage is not between the corresponding maximum value and the corresponding minimum value; and
   a fault indicator coupled to the power monitors, wherein the fault indicator is configured to indicate a fault for a first one of the power monitors which detects the corresponding voltage is not between the corresponding maximum value and the corresponding minimum value.

2. The fault detection system of claim 1, comprising:
   a system manager configured to receive one or more first signals and the second signal and store information which includes identification of the power monitors which provide the one or more first signals and the second signal.

3. The fault detection system of claim 2, wherein the corresponding voltages are provided by corresponding power converters, and wherein the identification of the power monitors includes identification of the corresponding power converters.

4. The fault detection system of claim 1, wherein the corresponding voltages are provided by power converters.

5. The fault detection system of claim 4, wherein the power converters comprise DC to DC converters, and wherein at least one of the DC to DC converters has one or more inputs which are corresponding voltages from other DC to DC converters.

6. The fault detection system of claim 4 wherein the power converters comprise at least one AC to DC converter.

7. A fault detection system comprising:
   power monitors, each configured to detect when a corresponding voltage is not between a corresponding maximum value and a corresponding minimum value; and
   a fault indicator coupled to the power monitors, wherein the fault indicator is configured to indicate a fault for a first one of the power monitors which detects the corresponding voltage is not between the corresponding maximum value and the corresponding minimum value, wherein the fault indicator is configured to indicate at least a first state and a second state, and wherein the fault indicator indicates the first state until the first one of the power monitors which detects the corresponding voltage is not between the corresponding maximum value and the corresponding minimum value sets the fault indicator to the second state.

8. The fault detection system of claim 7, wherein the fault indicator comprises a bus configured to be set to one of a first voltage level and a second voltage level, and wherein the first state corresponds to the first voltage level and the second state corresponds to the second voltage level.

9. The fault detection system of claim 7, wherein the fault indicator includes one or more data storage locations which are configured to store the first state and the second state.

10. A fault detection system, comprising
a plurality of voltage rails;
a plurality of voltage fault detectors, wherein each one of the plurality of voltage fault detectors is coupled to a corresponding one of the plurality of voltage rails;
a bus coupled to the plurality of voltage fault detectors, wherein the bus is configured to have an unasserted state which indicates that all of the plurality of voltage rails are in regulation, and wherein the bus is asserted by a first one of the plurality of voltage fault detectors which has the corresponding one of the plurality of voltage rails go out of regulation.

11. The fault detection system of claim 10, wherein each one of the plurality of voltage fault detectors comprises:
monitor logic coupled to the bus, wherein the monitor logic includes a storage device configured to be switched from a first state to a second state if the bus is not asserted and the corresponding one of the plurality of voltage rails goes out of regulation.

12. The fault detection system of claim 11, wherein the corresponding one of the plurality of voltage rails goes out of regulation if a voltage level on the corresponding one of the plurality of voltage rails is not between a maximum value and a minimum value.

13. The fault detection system of claim 11, wherein each one of the plurality of voltage fault detectors comprises:
a switching circuit coupled to the monitor logic, wherein the switching circuit is configured to assert the bus when the storage device is switched to the second state.

14. The fault detection system of claim 13, wherein each one of the plurality of voltage fault detectors comprises:
a voltage monitor, wherein the voltage monitor is configured to provide a first signal to the monitor logic if the corresponding one of the plurality of voltage rails goes out of regulation.

15. The fault detection system of claim 14, wherein the monitor logic is configured to determine if the bus is asserted when the first signal is received, and wherein the storage device is switched to the second state if the bus is not asserted.

16. The fault detection system of claim 10, comprising:
a plurality of power supplies, wherein each one of the plurality of power supplies is coupled to the corresponding one of the plurality of voltage rails.

17. The fault detection system of claim 16, wherein one or more of the plurality of power supplies are DC to DC converters.

18. The fault detection system of claim 17, wherein at least one of the DC to DC converters has one or more inputs which are coupled to one or more of the plurality of voltage rails.

19. The fault detection system of claim 16, wherein one or more of the plurality of power supplies are AC to DC converters.

20. A fault monitor, comprising:
a bus having a state including one of an asserted state and an unasserted state;
a switch which includes an input and an output coupled to the bus;
a storage device which includes an input, an enable terminal, and an output coupled to the input of the switch;
a voltage monitor which includes an output and an input coupled to a voltage rail; and
logic which includes an input coupled to the bus, an input coupled to the output of the voltage monitor, and an input coupled to the output of the storage device, wherein the logic includes an output coupled to the input of the storage device and an output coupled to the enable terminal of the storage device, wherein the logic is configured to store the state of the bus in the storage device if the voltage rail goes out of regulation.

21. The fault monitor of claim 20, wherein if the logic stores the unasserted state in the storage device, the logic disables the enable terminal of the storage device to lock the unasserted state in the storage device while the voltage rail is out of regulation.

22. The fault monitor of claim 21, wherein the switch drives the bus to the asserted state when the storage device is storing the unasserted state.

23. A method of detecting a fault, comprising:
monitoring powers to detect when a corresponding voltage of a corresponding power is not between a corresponding maximum value and a corresponding minimum value; and
indicating a fault for a first one of the monitored powers having its corresponding voltage not between its corresponding maximum value and its corresponding minimum value, wherein indicating a fault comprises:
providing a first signal for each monitored power having its corresponding voltage not between its corresponding maximum value and its corresponding minimum value; and
providing a second signal only for the first one of the monitored powers having its corresponding voltage not between its corresponding maximum value and its corresponding minimum value.

24. The method of claim 23, wherein indicating a fault comprises:
indicating a first state to provide an indication that all of the corresponding voltages are between their corresponding maximum value and their corresponding minimum value;
indicating a second state when the second signal is provided and
verifying, before providing the second signal, that only the first one of the monitored powers has its corresponding voltage not between its corresponding maximum value and its corresponding minimum value by verifying that the first state is indicated.

25. A fault detection system, comprising:
a plurality of voltage rails;
means for detecting faults in each of the plurality of voltage rails; and
means responsive to the means for detecting faults for indicating an unasserted state when all of the plurality of voltage rails are in regulation and for indicating an asserted state when a first one of the plurality of voltage rails has gone out of regulation in response to means for detecting faults detecting a fault in the first one of the plurality of voltage rails.

* * * * *

UNITED STATES PATENT AND TRADEMARK OFFICE
CERTIFICATE OF CORRECTION

PATENT NO. : 7,148,695 B2  Page 1 of 1
APPLICATION NO. : 11/112121
DATED : December 12, 2006
INVENTOR(S) : John Malvern Swope et al.

It is certified that error appears in the above-identified patent and that said Letters Patent is hereby corrected as shown below:

Title page, Item (56), under "U.S. PATENT DOCUMENTS", in column 2, line 6, delete "2006/0043943" and insert -- 2006/0043946 --, therefor.

Signed and Sealed this

Seventeenth Day of November, 2009

David J. Kappos
*Director of the United States Patent and Trademark Office*